(12) United States Patent
Park et al.

(10) Patent No.: US 11,811,024 B2
(45) Date of Patent: Nov. 7, 2023

(54) BMS AND BATTERY SYSTEM

(71) Applicant: SK On Co., Ltd., Seoul (KR)

(72) Inventors: Jung Hwan Park, Daejeon (KR); Woo Jung Kim, Daejeon (KR); Yong Sug Choi, Daejeon (KR)

(73) Assignee: SK On Co., Ltd., Seoul (KR)

( * ) Notice: Subject to any disclaimer, the term of this patent is extended or adjusted under 35 U.S.C. 154(b) by 0 days.

(21) Appl. No.: 17/740,964

(22) Filed: May 10, 2022

(65) Prior Publication Data
US 2022/0367926 A1 Nov. 17, 2022

(30) Foreign Application Priority Data
May 11, 2021 (KR) .................. 10-2021-0060690

(51) Int. Cl.
| | |
|---|---|
| *G01R 31/00* | (2006.01) |
| *H01M 10/42* | (2006.01) |
| *H02J 7/00* | (2006.01) |
| *G01R 31/327* | (2006.01) |
| *H01M 10/48* | (2006.01) |
| *H01M 10/44* | (2006.01) |
| *H01M 10/46* | (2006.01) |
| *G01R 31/3832* | (2019.01) |

(52) U.S. Cl.
CPC ...... *H01M 10/425* (2013.01); *G01R 31/3278* (2013.01); *G01R 31/3832* (2019.01); *H01M 10/441* (2013.01); *H01M 10/46* (2013.01); *H01M 10/482* (2013.01); *H02J 7/0063* (2013.01); *H01M 2010/4271* (2013.01)

(58) Field of Classification Search
USPC .......................................... 324/426, 432–435
See application file for complete search history.

(56) References Cited

U.S. PATENT DOCUMENTS 5,498,950 A * 3/1996 Ouwerkerk ............. B60L 58/15
320/152
9,417,644 B2 8/2016 Kim et al.
(Continued)

FOREIGN PATENT DOCUMENTS

JP 3265269 B2 3/2002
KR 100614871 B1 8/2006
(Continued)

*Primary Examiner* — Vincent Q Nguyen
(74) *Attorney, Agent, or Firm* — THE WEBB LAW FIRM

(57) ABSTRACT

Provided are a battery management system (BMS) and a battery system capable of accurately measuring a voltage without using a precise resistance element and reducing an error even when operating in a wide temperature range. Since a correction amount for the resistor included in the voltage measurement module is generated using a diagnostic power source configured independently of the battery system, and a voltage of the circuit included in the battery system is measured by applying the generated correction amount, the voltage may be precisely measured without using a high-precision resistance element. Since a change-over switch operates periodically to generate and apply an updated correction amount according to a changing environment, the voltage may be precisely measured even if it is applied to a system in which the environment continuously changes, such as a driving electric vehicle.

10 Claims, 7 Drawing Sheets

(56) References Cited

U.S. PATENT DOCUMENTS 10,330,710 B2    6/2019  Kim et al.
2018/0284196 A1* 10/2018  Tomonaga .......... H01M 10/482

FOREIGN PATENT DOCUMENTS

| KR | 1020080070099 A | 7/2008 |
|----|-----------------|--------|
| KR | 101138590 B1    | 5/2012 |
| KR | 1020140085102 A | 7/2014 |
| KR | 1020140106240 A | 9/2014 |
| KR | 101471969 B1    | 12/2014 |
| KR | 1020180137939 A | 12/2018 |
| KR | 1020200137304 A | 12/2020 |

* cited by examiner

BMS AND BATTERY SYSTEM

CROSS-REFERENCE TO RELATED APPLICATION

This application claims priority to Korean Patent Application No. 10-2021-0060690 filed May 11, 2021, the disclosure of which is hereby incorporated by reference in its entirety.

BACKGROUND OF THE INVENTION

Field of the Invention

The following disclosure relates to a battery management system (BMS) and a battery system, and more particularly, to a BMS and a battery system capable of more accurately monitoring a battery or an inverter for a vehicle.

Description of Related Art

An electric vehicle is equipped with an electric motor and a high-voltage battery to generate driving power, and the high-voltage battery supplies power to the electric motor and the electric load through a battery relay and an inverter. For stable driving of the electric vehicle, it is necessary to continuously monitor a state of the electric vehicle by measuring the voltages of the high-voltage battery and the inverter.

An electric vehicle includes a high-voltage battery and an inverter connected to the high-voltage battery, and a relay is installed between the high-voltage battery and the inverter. For stable driving of the electric vehicle, it is necessary to monitor a state of the electric vehicle by measuring a voltage of a high-voltage battery, which is a power source of the electric vehicle.

A general voltage measurement circuit includes a voltage division resistor and a sensing resistor connected in series. In a voltage measurement method, when both ends of the voltage measurement circuit are connected to a node to be measured and a ground, respectively, and a voltage between the voltage division resistor and the sensing resistor is measured, a voltage of the node to be measured may be calculated based on previously known values of the voltage division resistor and the sensing resistor, and the measured voltage value.

A factor causing a voltage measurement error in such a voltage measurement circuit is an error of the voltage division resistor and the sensing resistor. In a circuit for measuring a high voltage, since the voltage division resistor actually includes a plurality of resistors connected in series due to a limitation of a withstand voltage specification, the error increases in multiples according to the number of resistors connected in series. Since electric vehicle manufacturers are recently demanding precise voltage measurement values for accurate battery capacity calculation and diagnosis of the state of the electric vehicles, it is necessary to solve such an error problem of the resistor.

The simplest way to solve the error problem of the resistor is to use a precision resistance element with a low error rate. However, when a precision resistance element is used, there is a problem in that a component price increases. In addition, a driving environment of a vehicle has a wide range of temperature environments depending on time and location, causing a temperature coefficient deviation of the resistor according to ambient temperature fluctuations, and as a result, there is also a problem in that a certain degree of error occurs even when the precision resistance element is used.

RELATED ART DOCUMENT

Patent Document

Korean Patent Laid-Open Publication No. 10-2020-0137304 ("METHOD AND SYSTEM FOR PROVIDING BATTERY CHARGING AND EXCHANGING INFORMATION FOR ELECTRIC VEHICLE" published on Dec. 9, 2020)

SUMMARY OF THE INVENTION

An embodiment of the present invention is to provide a BMS and a battery system that enable precise voltage measurement without using a precise resistance element and reduce an error even when operating in a wide temperature range.

In one general aspect, a battery management system (BMS) that measures a voltage of a circuit inside a battery system, includes: a voltage measurement module including first to n-th voltage measurement units for measuring a voltage; switch modules provided between the first to n-th voltage measurement units and the battery system, respectively, and including first to n-th switches for forming or blocking an electrical path; a diagnostic power source that provides a constant voltage; changeover switches provided between the first to n-th voltage measurement units and the diagnostic power source and electrically connecting the diagnostic power source to any one selected from the first to n-th voltage measurement units; and a control unit controlling the switch modules and the changeover switches, and calculating voltage information of the circuit inside the battery system based on voltage information obtained from the voltage measurement module.

The control unit may be configured to: calculate a correction amount of an i-th voltage measurement unit based on voltage information measured by the i-th voltage measurement unit, when the i-th voltage measurement unit, which is any one of the first to n-th voltage measurement units, is electrically connected to the diagnostic power source, and calculate the voltage information of the circuit inside the battery system by reflecting the correction amount to the voltage information measured by the i-th voltage measurement unit, when the i-th voltage measurement unit is connected to the battery system, in which n (natural number) ≥1, and n (natural number) ≥i (natural number) ≥1.

The i-th voltage measurement unit may include: two or more resistors connected to the circuit inside the battery system and connected in series with each other; and a voltage sensor for measuring a potential of a node between two adjacent resistors among the resistors.

The control unit may control the changeover switch so that the first to n-th voltage measurement units are sequentially connected to the diagnostic power source.

The control unit may control the changeover switch to connect the first to n-th voltage measurement units to the diagnostic power to calculate a correction amount, and then control the switch modules to connect the first to n-th voltage measurement units to the circuit inside the battery system to calculate the voltage information of the circuit inside the battery system to which the correction amount is reflected.

When the diagnostic power source and the i-th voltage measurement unit are connected, the i-th voltage measurement unit may measure the voltage at least twice or more, and the control unit may calculate a correction amount based on an average value of a plurality of voltage measurement values measured by the i-th voltage measurement unit.

The control unit may control the changeover switch so that the diagnostic power source and the i-th voltage measurement unit are connected for a predetermined period of time, the i-th voltage measurement unit may measure the voltage for a time connected to the diagnostic power source, and the control unit may generate a correction amount based on an average value of the measured voltage.

The control unit may calculate a correction amount based on the voltage repeatedly measured in a state in which the diagnostic power source and the i-th voltage measurement unit are connected, and calculate the correction amount using the remaining measured voltages except for the measured voltage which is out of a reference range when the measured voltage is out of the reference range.

In another general aspect, a battery system connected to a load, includes: a battery module including a plurality of battery cells and having positive and negative terminals; a positive main relay and a negative main relay respectively provided between the positive and negative terminals of the battery module and the load; an initial charging circuit unit connected in parallel with the positive main relay or the negative main relay, and having a resistor and an auxiliary relay connected in series therewith; and the BMS described above.

The voltage measurement module may include: a first voltage measurement unit for measuring a voltage of the positive terminal of the battery module; a second voltage measurement unit for measuring a voltage of a node to which the resistor and the auxiliary relay are connected in series; and a third voltage measurement unit for measuring a voltage applied to an input terminal of the load, and the control unit may determine whether at least one of the positive main relay, the negative main relay, and the auxiliary relay fails based on voltage information measured by the first to third voltage measurement units.

The switch module may include: a first switch provided between the positive terminal of the battery module and the first voltage measurement unit; a second switch provided between the node to which the resistor and the auxiliary relay are connected in series and the second voltage measurement unit; and a third switch provided between the input terminal of the load and the third voltage measurement unit, and the control unit may sequentially control the first to third switches so that the first to third voltage measurement units sequentially measure voltages.

DESCRIPTION OF THE INVENTION

Figure 1:
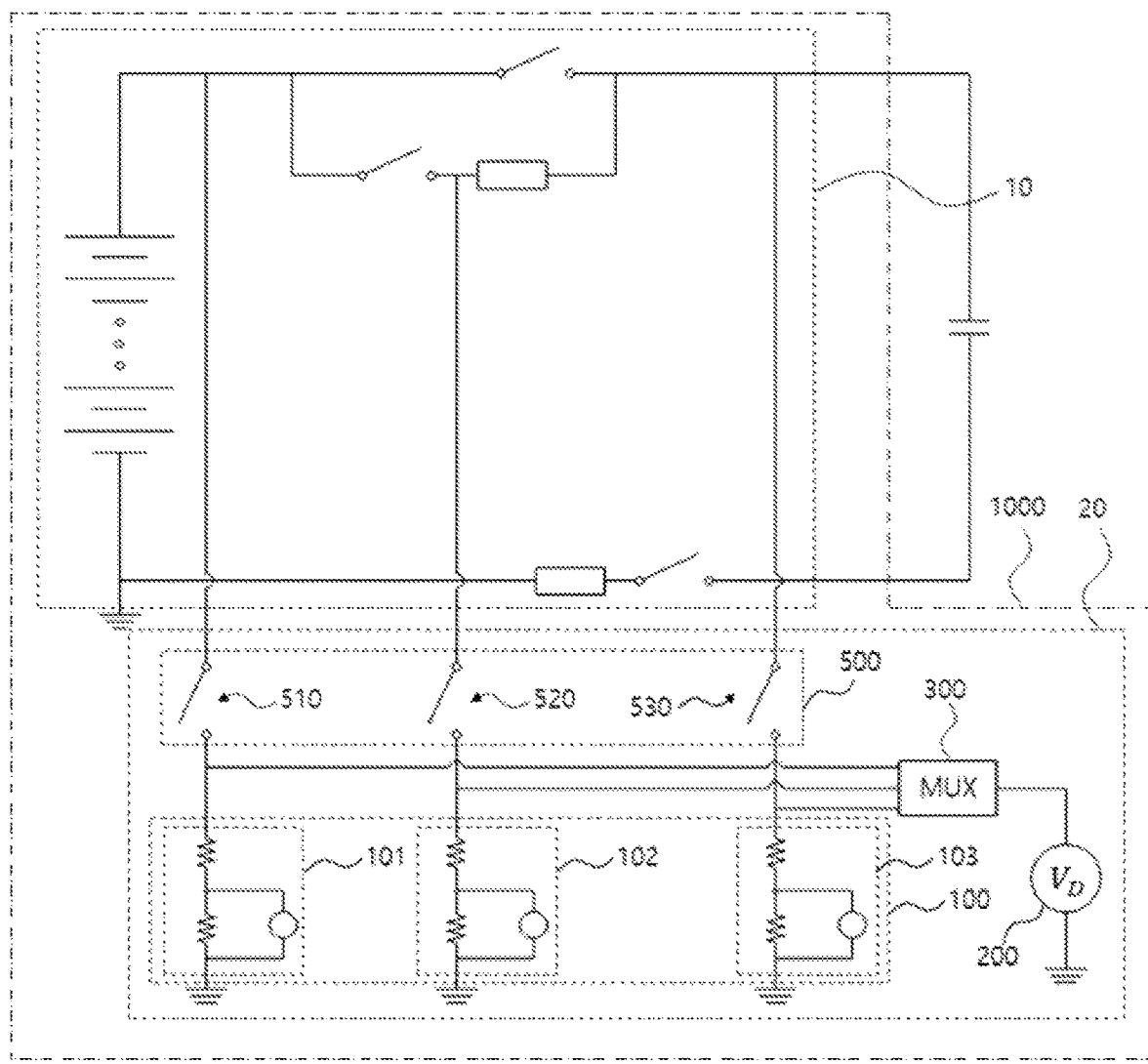
FIG. 1 is a circuit diagram of a battery system according to a first embodiment of the present invention.

The objects, features and advantages of the present invention described above will become more apparent through the following embodiments in conjunction with the accompanying drawings. The following specific structural or functional descriptions are only exemplified for the purpose of describing embodiments according to the concept of the present invention, and the embodiments according to the concept of the present invention may be implemented in various forms and should not be construed as being limited to the embodiments described in the present specification or application. Since the embodiments according to the concept of the present invention may be variously modified and may have several forms, specific embodiments will be illustrated in the accompanying drawings and will be described in detail in the present specification or application. However, this is not intended to limit the embodiments according to the concept of the present invention to a specific disclosure form, and it should be understood to include all modifications, equivalents, or substitutes included in the spirit and scope of the present invention. Terms such as "first", "second", etc. may be used to describe various components, but the components are not to be construed as being limited to the terms. The terms are used only to distinguish one component from another component. For example, a first component may be named a second component and the second component may also be named the first component, without departing from the scope of the present invention. It is to be understood that when one component is referred to as being "connected to" or "coupled to" another component, it may be connected directly to or coupled directly to another component or be connected to or coupled to another component with the other component interposed therebetween. On the other hand, it is to be understood that when one component is referred to as being "connected directly to" or "coupled directly to" another component, it may be connected to or coupled to another component without the other component interposed therebetween. Other expressions describing a relationship between components, that is, "between", "directly between", "neighboring", "directly neighboring", and the like, should be similarly interpreted. The terms used in the present specification are only used to describe specific embodiments, and are not intended to limit the present invention. Singular expressions include plural expressions unless the context clearly indicates otherwise. It is to be understood that terms "include", "have", or the like, used in the present specification specify the presence of features, numerals, steps, operations, components, parts, or a combination thereof stated in the present specification, but do not preclude the presence or addition of one or more other features, numerals, steps, operations, components, parts, or a combination thereof. Unless otherwise defined, all terms, including technical or scientific terms, used herein have the same meaning as commonly understood by one of ordinary skill in the art to which the present invention belongs. Terms generally used and defined in a dictionary are to be interpreted as the same meanings with meanings within the context of the related art, and are not to be interpreted as ideal or excessively formal meanings unless clearly indicated in the present specification. Hereinafter, the present invention will be described in detail by describing embodiments of the present invention with reference to the accompanying drawings. Like reference numerals proposed in each drawing denote like components.

FIG. 1 is a circuit diagram of a battery system according to a first embodiment of the present invention.

As illustrated in FIG. 1, a battery system 1000 according to a first embodiment of the present invention may include a system circuit 10 and a battery management system (BMS) 20. The BMS 20 may include a voltage measurement module 100, a diagnostic power source 200, a changeover switch 300, a control unit (not illustrated), and a switch module 500.

The system circuit 10 may be a circuit used in various fields, including a battery module 1100 including a plurality of battery cells. In the battery system according to the first embodiment of the present invention, the system circuit 10 may be a battery module used in an electric vehicle and a circuit related thereto.

Figure 2:
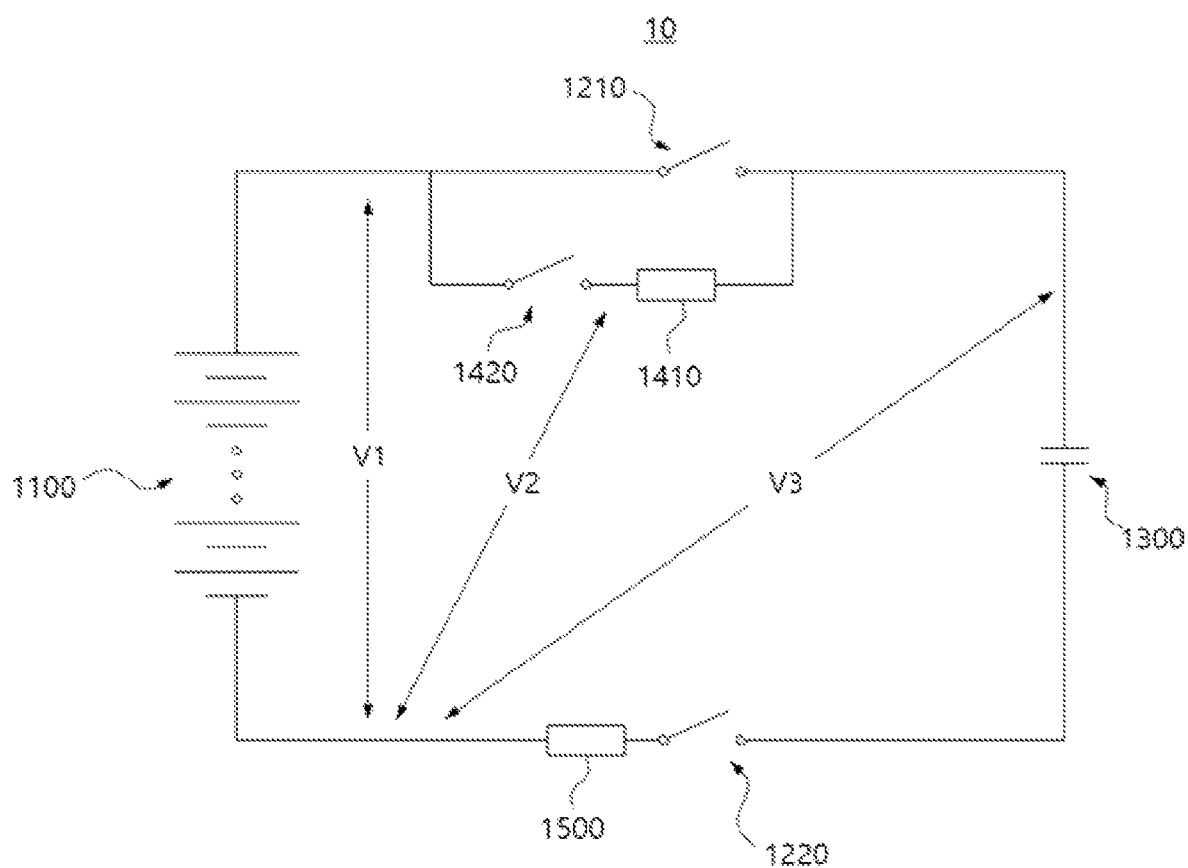
FIG. 2 is a circuit diagram of a system circuit 10 of the battery system according to the first embodiment of the present invention.

FIG. 2 is a circuit diagram of a system circuit 10 of the battery system according to the first embodiment of the present invention.

As illustrated in FIG. 2, the system circuit 10 of the battery system according to the first embodiment of the present invention may include a battery module 1100, a positive main relay 1210, a negative main relay 1220, a first capacitor 1300, a pre-charge resistor 1410, a pre-charge relay 1420, and a shunt resistor 1500. The first capacitor 1300 may be a component included in a load (inverter), which is a type of load connected to the battery module 1100 and receiving power from the battery module 1100. The pre-charge resistor 1410 and the pre-charge relay 1420 are initial charging circuit units.

In the present embodiment, it is necessary to monitor a state of the battery system included in the electric vehicle by measuring V1, which is a voltage across the battery module 1100, V2, which is a voltage between the pre-charge resistor 1410 and the pre-charge relay 1420 at a negative electrode of the battery module 1100, and V3, which is a voltage between one end of the first capacitor 1300 and the negative electrode of the battery module 1100. Here, V1 is to measure an application state of the battery module 1100, V2 is to measure a high voltage application state of a pre-charge path, and V3 is to measure a high voltage application state of an inverter stage including the first capacitor 1300.

Again, the voltage measurement module 100 illustrated in FIG. 1 is a device for measuring voltages of internal circuits included in the above-described battery system 1000, that is, V1, V2, and V3.

Figure 3:
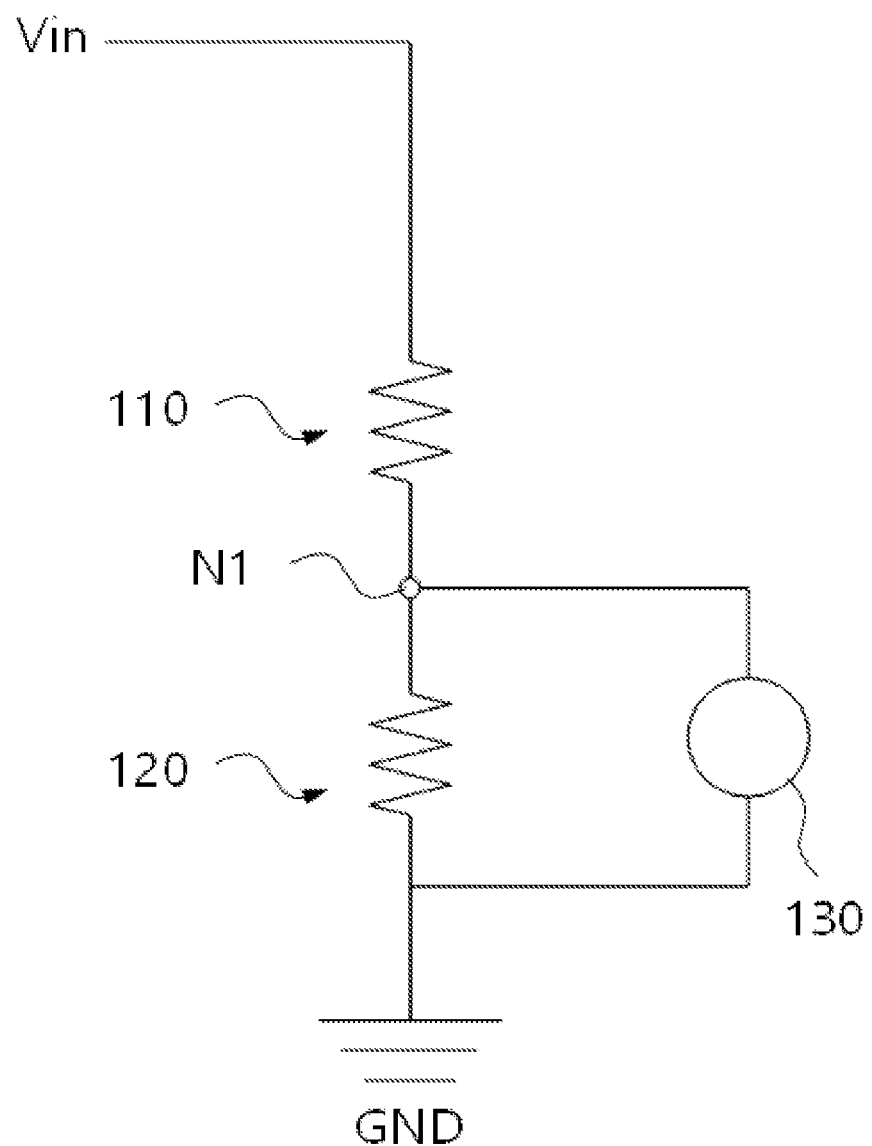
FIG. 3 illustrates only a first voltage measurement unit 101 of a voltage measurement module 100 of the battery system according to the first embodiment of the present invention.

FIG. 3 illustrates only a first voltage measurement unit 101 of a voltage measurement module 100 of the battery system according to the first embodiment of the present invention.

As illustrated in FIG. 3, in the present embodiment, a first voltage measurement unit 101 includes a voltage division resistor 110 and a sensing resistor 120, and further includes a voltage sensor 130 that measures a voltage of a node N1 between the voltage division resistor 110 and the sensing resistor 120, thereby measuring V1 among the V1 to V3 described above. Each of V2 and V3 is sequentially measured by a second voltage measurement unit 102 and a third voltage measurement unit 103, and components included in each of the first to third voltage measurement units 101, 102, and 103 are the same as each other.

The voltage division resistor 110 and the sensing resistor 120 included in the first voltage measurement unit 101 are the same as the configurations of the same name described in the background art, and the voltage division resistor 110 may be used by connecting a plurality of resistors in series due to a withstand voltage limit. That is, although the voltage division resistor 110 is illustrated as a single unit in the drawing, it may be actually a form in which a plurality of resistors are connected in series. In order to measure a voltage in a specific section of the system circuit 10 described above, upper and lower ends of the first voltage measurement unit 101 illustrated in FIG. 3 are connected to corresponding nodes, and when connecting to a diagnostic power source 200 to be described later, Vin of the upper end is connected to the diagnostic power source 200 to be described later, and the lower end is connected to the ground.

The diagnostic power source 200 is insulated from the system circuit 10 of the battery system 1000 and provides a constant voltage. The constant voltage output from the diagnostic power source 200 has a preset value.

The changeover switch 300 connects the voltage measurement module 100 to the system circuit 10 of the battery system 1000 or to the diagnostic power source 200. This is to calculate a correction amount due to an error of a plurality of resistors included in each of the voltage measurement units of the voltage measurement module 100 using the diagnostic power source 200, and to use the calculated correction amount when measuring the voltage in the specific section of the system circuit 10, which will be described in detail later.

The control unit controls the changeover switch 300, receives or reads the measured voltage from each voltage measurement unit included in the voltage measurement module 100, and calculates voltage information of the system circuit 10 based on the voltages measured by the voltage measurement units. More specifically, the control unit controls the changeover switch 300 to allow the voltage sensor 130 to measure the voltage of the node N1 in a state in which any one of the first to third voltage measurement units of the voltage measurement module 100 and the diagnostic power source 200 are connected to each other, and compares the voltage measurement value of the node N1 measured by the voltage sensor 130 and the calculated voltage of the node N1 calculated through the constant voltage output from the voltage division resistor 110, the sensing resistor 120, and the diagnostic power source 200 to calculate the correction amount.

The above-described process will be described as an example. When the voltage of the diagnostic power source 200 is 10 V and the voltage division resistor 110 and the sensing resistor 120 are each 5 ohms, the calculated voltage of the node N1 becomes 5 V according to the voltage division law. However, this is a theoretical value, and due to an error of the voltage division resistor 110 and the sensing resistor 120, the voltage of the node N1 measured by the voltage sensor 130 may be 5.5 V, which is different from the calculated voltage of 5 V. Among the measured voltage and the calculated voltage, the calculated voltage calculated through the reference voltage of the diagnostic power source 200, the resistance value of the voltage division resistor 110, and the resistance value of the sensing resistor 120 is a more accurate value. Therefore, the controller may correct the measured value of the voltage sensor 130 by multiplying the measured value of the node N1 measured by the voltage sensor 130 by 0.91 (an approximation of a value obtained by dividing 5 V by 5.5 V) as a correction amount or by adding −0.5 V as a correction amount. When the measured voltage and the calculated voltage are the same, in the case of multiplying the correction amount, the correction amount may be 1, and in the case of adding the correction amount, the correction amount may be 0.

After generating the correction amount by using the diagnostic power source 200 and the voltage measurement units of the voltage measurement module 100, the control unit may control the changeover switch 300 to connect the voltage measurement units and the system circuit 10 to each other.

In order to measure V1, V2, and V3 in the first to third voltage measurement units 101, 102, and 103, respectively, a single voltage measurement unit needs to be connected to measure each of V1, V2, and V3. However, in the present invention, the method of measuring V1, V2, and V3 is not limited thereto, and there is also an embodiment of a method in which a single voltage measurement unit is sequentially connected to the V1, V2, and V3 sections to measure the voltage of each section.

Figure 4:
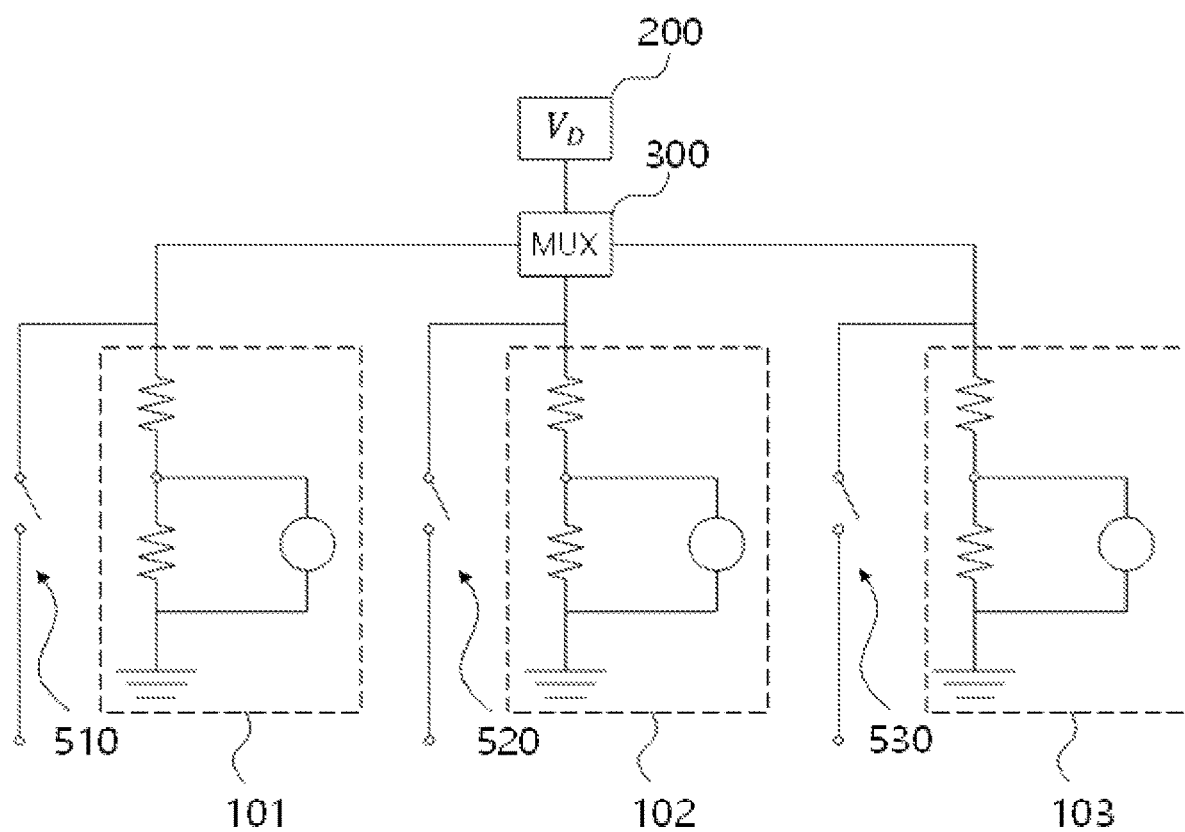
FIG. 4 illustrates only a BMS 20 according to the first embodiment of the present invention illustrated in FIG. 1.

FIG. 4 illustrates only a BMS 20 according to the first embodiment of the present invention illustrated in FIG. 1.

As illustrated in FIG. 4, when the voltage measurement module 100 includes a first voltage measurement unit 101, a second voltage measurement unit 102, and a third voltage measurement unit 103, the changeover switch 300 may be implemented in the form of a multiplexer (MUX) for determining whether to connect to the diagnostic power source 200. The voltage measurement module 100 may connect only one of the first voltage measurement unit 101, the second voltage measurement unit 102, and the third voltage measurement unit 103 to the diagnostic power source 200, or may not connect all voltage measurement units to the diagnostic power source 200. In addition, in the present embodiment, as a total of three voltage measurement units are used, individual correction values may be calculated by connecting each voltage measurement unit to the diagnostic power source 200.

As illustrated in FIGS. 1 and 4, a first switch 510, a second switch 520, and a third switch 530 have one end connected between the voltage measurement units and the changeover switch 300, respectively, and have the other end connected to portions for measuring V1, V2, and V3 on the system circuit 10.

More specifically, assuming that the ground is connected to the node between the battery module 1100 and the shunt resistor 1500 of the system circuit 10, the other end of the first switch 510 may be connected to the positive electrode of the battery module 1100, the other end of the second switch 520 may be connected between the pre-charge resistor 1410 and the pre-charge relay 1420, and the other end of the third switch 530 may be connected between the first capacitor 1300 and the positive main relay 1210.

The control unit may perform control so that only one of the first switch 510, the second switch 520, and the third switch 530 is turned on to measure a voltage in a section to which the corresponding switch is connected, and the others are turned off. For example, the first switch 510, the second switch 520, and the third switch 530 may sequentially operate. As the first switch 510, the second switch 520, and the third switch 530 sequentially operate, the control unit measures the voltage of the node N1 for each voltage measurement unit, and corrects or reduces the error due to the resistor by applying the previously calculated correction amount to obtain a more accurately measured value. Referring to FIG. 2, in the case of measuring V2 in the present embodiment (when the second voltage measurement unit 102 is used), V2 may be measured with the negative main relay 1220 and the pre-charge relay 1420 turned on and the positive main relay 1210 turned off, and in the case of measuring V3, V3 may be measured after the pre-charge relay 1420 is turned off, and the positive main relay 1210 and the negative main relay 1220 are then turned on.

The operation of the control unit of connecting each of the first to third voltage measurement units to the diagnostic power source 200 to generate the correction amount, and connecting the first to third voltage measurement unit to the system circuit 10 to measure V1, V2, and V3 and then applying the correction amount, which are the processes described above, may be repeatedly performed. This is because, since an environment (temperature) continuously changes according to the driving of the electric vehicle, the correction amount may vary due to the change in resistance according to the changing environment. That is, the control unit may control the changeover switch 300, the first switch 510, the second switch 520, and the third switch 530 to periodically operate so that the correction amount is periodically calculated, and may use the recently generated correction amount to enable more accurate monitoring of the system circuit 10.

In addition, the control unit may calculate a plurality of correction amounts by repeatedly measuring the voltage for a predetermined time or a predetermined number of times in the state in which the diagnostic power source 200 and the voltage measurement units of the voltage measurement module 100 are connected, and may calculate an average value of the calculated correction amount and use the calculated average correction amount. In this case, when the voltage measured by any one of the voltage measurement units of the voltage measurement module 100 is out of the reference range of the calculated voltage, the controller may calculate the correction amount by using an average of the remaining measured voltages except for the measured voltage or the calculated correction amount in the corresponding case, or may obtain and use an average value using only the remaining correction amounts except for the corresponding correction amount.

In addition, when a case in which the voltage measured by a specific voltage measurement unit included in the voltage measurement module 100 is out of the reference range of the calculated voltage occurs more than a predetermined number of times, the control unit may generate a fault signal for the corresponding voltage measurement unit.

Further, in the present embodiment, in the case in which any one of the measured voltages of V1, V2, and V3 is out of the reference range when measuring V1, V2, and V3 by turning on each of the first switch 510, the second switch 520, and the third switch 530, the control unit may generate the fault signal, and in this case, the generated fault signal may be a fault signal for a specific path of the system circuit 10.

Figure 5A:
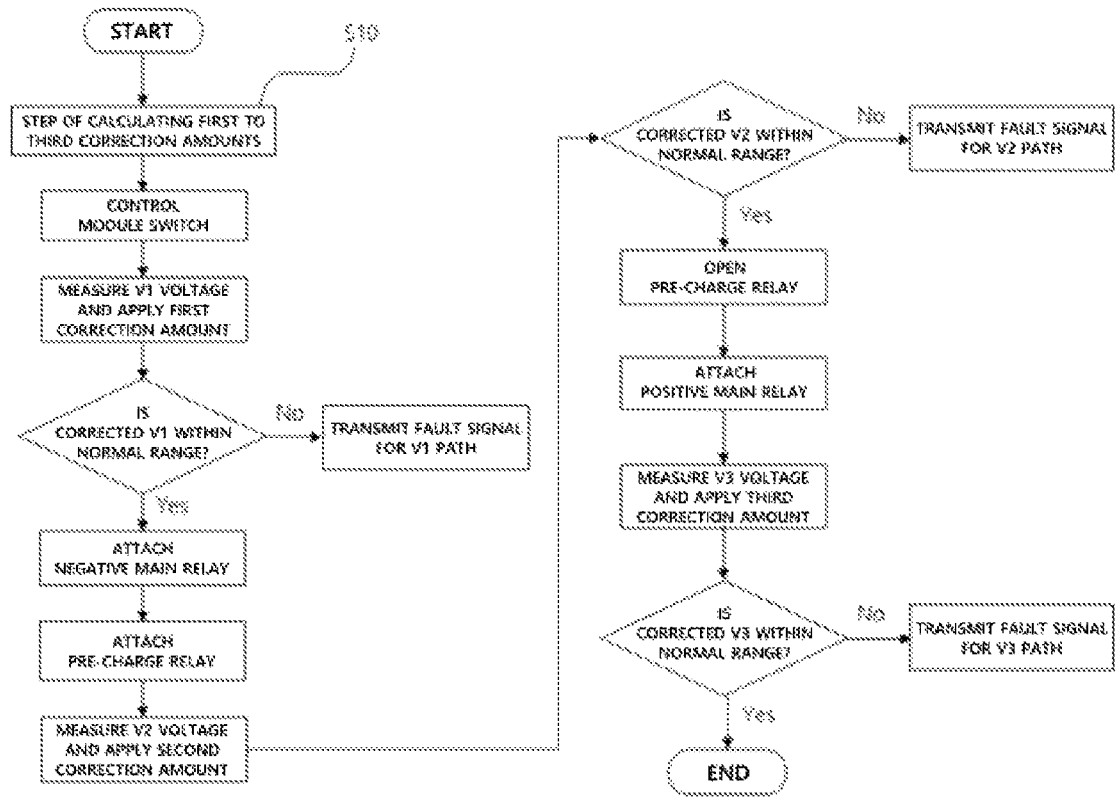
FIG. 5A is a flowchart of generating fault signals when correction amounts generated by first to third voltage measurement units and values of V1, V2, and V3 measured by each voltage measurement unit are out of a reference range during an operation of the control unit described above.

FIG. 5A is a flowchart of generating fault signals when correction amounts generated by first to third voltage measurement units and values of V1, V2, and V3 measured by each voltage measurement unit are out of a reference range during an operation of the control unit described above.

Figure 5B:
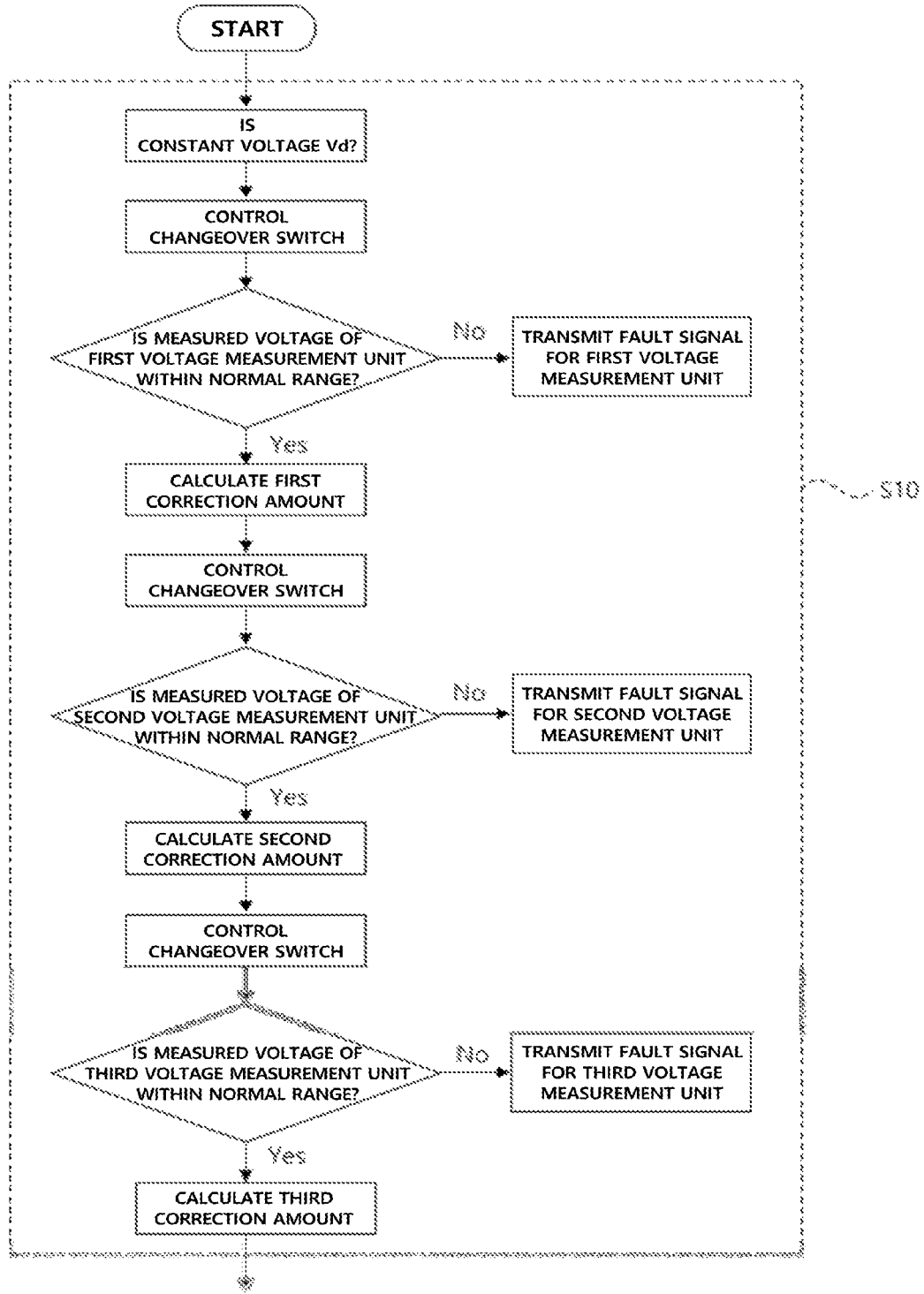
FIG. 5B is a flowchart of a process of calculating a correction amount in the first to third voltage measurement units during the operation of the control unit described above.

As illustrated in FIG. 5A, a correction amount generating step (S10) is briefly illustrated, and FIG. 5B sequentially illustrates a detailed operation of the above-described correction amount generating step (S10), that is, a process of calculating the correction amounts by the first to third voltage measurement units. In FIG. 5B, when measuring the voltage in each of the first to third voltage measurement units, it is determined whether the measured value is within a normal range, and when the measured value is out of the normal range, a separate fault signal may be generated. Here, for each of the correction amounts of the first to third voltage measurement units, when the measured voltage and the calculated voltage are the same, in the case of multiplying the correction amount, the correction amount may be 1, and in the case of adding the correction amount, the correction amount may be 0.

Figure 6:
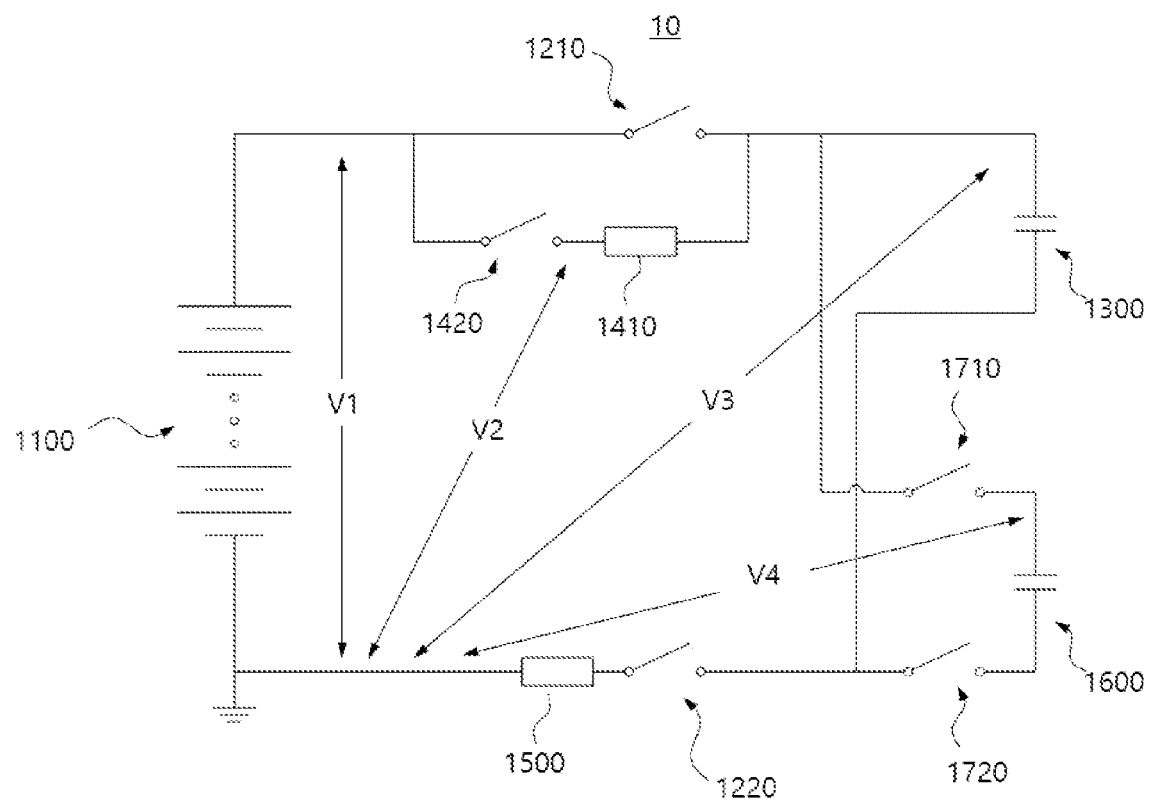
FIG. 6 is a circuit diagram of a system circuit 10 of a battery system 1000 according to a second embodiment of the present invention.

FIG. 6 is a circuit diagram of a system circuit 10 of a battery system 1000 according to a second embodiment of the present invention.

As illustrated in FIG. 6, a system circuit 10 of a battery system 1000 according to a second embodiment of the present invention may further include a second capacitor 1600 of a charging unit connected in parallel with the first capacitor 1300 in the system circuit 10 of the battery system 1000 according to the first embodiment of the present invention described above, and may further include a first charge relay 1710 and a second charge relay 1720 connected in series with the second capacitor 1600 at both ends of the second capacitor 1600, respectively. The charging unit may be a type of load connected to the battery module 1100. In the present embodiment, as the second capacitor 1600 included in the charging unit is additionally included, it is necessary to measure a voltage across the second capacitor 1600, that is, V4, and therefore, the system circuit 10 may further include a fourth voltage measurement unit (not illustrated) for measuring V4 and a fourth switch (not illustrated) connected to the fourth voltage measurement unit.

As may be seen from the BMS and the battery system according to the first and second embodiments of the present invention described above, the battery system 1000 according to the present invention has an effect of precisely measuring a voltage application state for a specific component included in the battery system 1000 by adding a separate switch and a voltage measurement module even when the voltage measurement points increase.

With the BMS and the battery system according to the present invention as described above, since the correction amount is calculated using a diagnostic power source that is isolated from the circuit of the battery system and configured independently, and the voltage inside the circuit of the battery system is measured and corrected using the calculated correction amount, it is possible to precisely measure the voltage inside the circuit of the battery system without using a high-precision resistance element.

In addition, according to the present invention, since the control unit operates the changeover switch so that the voltage measurement module is periodically connected to the diagnostic power source, the voltage measurement module periodically measures the voltage while the diagnostic power is connected thereto, and the control unit calculates the correction amount based on the measured voltage, the voltage inside the circuit of the battery system may be measured more accurately by updating, calculating, and applying the correction amount even if the environment continuously changes like a driving electric vehicle.

In addition, according to the present invention, since the control unit controls the changeover switch to periodically connect the diagnostic power source and the voltage measurement unit included in the voltage measurement module, the voltage measurement unit measures the voltage for a predetermined time or a predetermined number of times in a state in which the diagnostic power source is connected thereto, and the control unit calculates the correction amount using the average value of the measured voltage, it is possible to more accurately measure the voltage inside the circuit of the battery system.

In addition, according to the present invention, since the correction amount is calculated using the remaining measured voltages except for the measured voltages that are out of the reference range, among the measured voltages repeatedly measured by the i-th voltage measurement unit, and the voltage information inside the circuit of the battery system is calculated using the calculated correction amount, it is possible to more accurately measure the voltage inside the circuit of the battery system.

The present invention is not limited to the above-mentioned embodiments, and may be variously applied, and may be variously modified without departing from the gist of the present invention claimed in the claims.

DETAILED DESCRIPTION OF MAIN ELEMENTS

1000: battery system
1100: battery module
1210: positive main relay
1220: negative main relay
1300: first capacitor
1410: pre-charge resistor
1420: pre-charge relay
1500: shunt resistor
1600: second capacitor
1710: first charge relay
1720: second charge relay
10: system circuit
20: BMS
100: voltage measurement module
101: first voltage measurement unit
102: second voltage measurement unit
103: third voltage measurement unit
110: division resistor
120: sensing resistor
130: voltage sensor
200: diagnostic power source
300: changeover switch
500: switch module
510: first switch
520: second switch
530: third switch

What is claimed is:

1. A battery management system (BMS) that measures a voltage of a circuit inside a battery system, the battery management system comprising:
   a voltage measurement module including first to n-th voltage measurement units for measuring a voltage;
   switch modules provided between the first to n-th voltage measurement units and the circuit inside the battery system, respectively, and including first to n-th switches for forming or blocking an electrical path;
   a diagnostic power source that provides a constant voltage;
   changeover switches provided between the first to n-th voltage measurement units and the diagnostic power source and electrically connecting the diagnostic power source to any one selected from the first to n-th voltage measurement units; and
   a control unit controlling the switch modules and the changeover switches, and calculating voltage information of the circuit inside the battery system based on voltage information obtained from the voltage measurement module, wherein the control unit is configured to:

calculate a correction amount of an i-th voltage measurement unit based on voltage information measured by the i-th voltage measurement unit, when the BMS and the circuit inside the battery system are separated and the i-th voltage measurement unit, which is any one of the first to n-th voltage measurement units, is electrically connected to the diagnostic power source, and calculate the voltage information of the circuit inside the battery system by reflecting the correction amount to the voltage information measured by the i-th voltage measurement unit, when an i-th switch, which is any one of the first to n-th switch, is turned on and the i-th voltage measurement unit is connected to the circuit inside the battery system, wherein n (natural number)≥1, and n (natural number)≥i (natural number)≥1.

2. The battery management system of claim 1, wherein the i-th voltage measurement unit includes:

two or more resistors connected to the circuit inside the battery system and connected in series with each other; and a voltage sensor for measuring a potential of a node between two adjacent resistors among the resistors.

3. The battery management system of claim 1, wherein the control unit controls the changeover switch so that the first to n-th voltage measurement units are sequentially connected to the diagnostic power source.

4. The battery management system of claim 1, wherein the control unit controls the changeover switch to connect the first to n-th voltage measurement units to the diagnostic power to calculate a correction amount, and then controls the switch modules to connect the first to n-th voltage measurement units to the circuit inside the battery system to calculate the voltage information of the circuit inside the battery system to which the correction amount is reflected.

5. The battery management system of claim 1, wherein when the diagnostic power source and the i-th voltage measurement unit are connected, the i-th voltage measurement unit measures the voltage at least twice or more, and the control unit calculates a correction amount based on an average value of a plurality of voltage measurement values measured by the i-th voltage measurement unit.

6. The battery management system of claim 1, wherein the control unit controls the changeover switch so that the diagnostic power source and the i-th voltage measurement unit are connected for a predetermined period of time, the i-th voltage measurement unit measures the voltage for a time connected to the diagnostic power source, and the control unit generates a correction amount based on an average value of the measured voltage.

7. The battery management system of claim 1, wherein the control unit calculates a correction amount based on the voltage repeatedly measured in a state in which the diagnostic power source and the i-th voltage measurement unit are connected, and calculates the correction amount using the remaining measured voltages except for the measured voltage which is out of a reference range when the measured voltage is out of the reference range.

8. A battery system connected to a load, the battery system comprising:

a battery module including a plurality of battery cells and having positive and negative terminals;

a positive main relay and a negative main relay respectively provided between the positive and negative terminals of the battery module and the load;

an initial charging circuit unit connected in parallel with the positive main relay or the negative main relay, and having a resistor and an auxiliary relay connected in series therewith; and the battery management system of claim 1.

9. The battery system of claim 8, wherein the voltage measurement module comprises:

a first voltage measurement unit for measuring a voltage of the positive terminal of the battery module;

a second voltage measurement unit for measuring a voltage of a node to which the resistor and the auxiliary relay are connected in series; and a third voltage measurement unit for measuring a voltage applied to an input terminal of the load, and the control unit determines whether at least one of the positive main relay, the negative main relay, and the auxiliary relay fails based on voltage information measured by the first to third voltage measurement units.

10. The battery system of claim 9, wherein the switch module includes:

a first switch provided between the positive terminal of the battery module and the first voltage measurement unit;

a second switch provided between the node to which the resistor and the auxiliary relay are connected in series and the second voltage measurement unit; and a third switch provided between the input terminal of the load and the third voltage measurement unit, and the control unit sequentially controls the first to third switches so that the first to third voltage measurement units sequentially measure voltages.

* * * * *